(12) United States Patent
Badrieh

(10) Patent No.: US 11,636,891 B2
(45) Date of Patent: Apr. 25, 2023

(54) VARYING A TIME AVERAGE FOR FEEDBACK OF A MEMORY SYSTEM

(71) Applicant: Micron Technology, Inc., Boise, ID (US)

(72) Inventor: Fuad Badrieh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/243,444

(22) Filed: Apr. 28, 2021

(65) Prior Publication Data
US 2022/0351771 A1 Nov. 3, 2022

(51) Int. Cl.
G11C 5/14 (2006.01)
G11C 11/4076 (2006.01)
G11C 11/4074 (2006.01)
H03F 3/45 (2006.01)
H02M 3/158 (2006.01)

(52) U.S. Cl.
CPC ............ *G11C 11/4076* (2013.01); *G11C 5/14* (2013.01); *G11C 5/143* (2013.01); *G11C 5/147* (2013.01); *G11C 11/4074* (2013.01); *H02M 3/158* (2013.01); *H03F 3/45071* (2013.01)

(58) Field of Classification Search
CPC .... G11C 11/4076; G11C 11/4074; G11C 5/14
See application file for complete search history.

(56) References Cited

U.S. PATENT DOCUMENTS

| | | | | |
|---|---|---|---|---|
| 5,648,766 A | * | 7/1997 | Stengel | G05F 1/46 455/343.1 |
| 7,692,977 B2 | * | 4/2010 | Kim | G11C 16/3454 365/185.25 |
| 9,189,053 B2 | * | 11/2015 | Cui | G06F 11/3058 |
| 9,852,808 B2 | * | 12/2017 | Qian | G11C 29/12015 |
| 2005/0105367 A1 | * | 5/2005 | Kim | G11C 11/4074 365/211 |
| 2005/0218871 A1 | * | 10/2005 | Kang | G06F 1/324 323/265 |
| 2007/0139099 A1 | * | 6/2007 | Pan | H02M 3/07 327/536 |
| 2011/0248688 A1 | * | 10/2011 | Iacob | G05F 1/575 323/234 |
| 2013/0223175 A1 | * | 8/2013 | Lee | G11C 5/147 365/228 |
| 2015/0029806 A1 | * | 1/2015 | Qiao | H02M 3/07 327/536 |
| 2019/0379284 A1 | * | 12/2019 | Brandonisio | H03L 7/093 |
| 2020/0152255 A1 | * | 5/2020 | Badrieh | G11C 11/4074 |
| 2022/0068345 A1 | * | 3/2022 | Chu | H03K 5/2481 |

* cited by examiner

*Primary Examiner* — Mushfique Siddique
(74) *Attorney, Agent, or Firm* — Holland & Hart, LLP

(57) ABSTRACT

Methods, systems, and devices for varying a time average for feedback of a memory system are described. An apparatus may include a voltage supply, a memory array, and a regulator coupled with the voltage supply and memory array and configured to supply a first voltage received from the voltage supply to the memory array. The apparatus may also include a voltage sensor configured to measure a second voltage of the memory array and a digital feedback circuit coupled with the memory array and regulator and configured to generate feedback comprising information averaged over a duration based at least in part on the second voltage measured by the voltage sensor and to transmit an analog signal to the regulator based at least in part on the feedback.

20 Claims, 6 Drawing Sheets

US 11,636,891 B2

VARYING A TIME AVERAGE FOR FEEDBACK OF A MEMORY SYSTEM

FIELD OF TECHNOLOGY

The following relates generally to one or more systems for memory and more specifically to varying a time average for feedback of a memory system.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

In some examples, a voltage source (e.g., in a power distribution network (PDN)) may supply a voltage to the memory array during an operation performed by the memory device. In some cases, an intrinsic capacitance and current demand of the memory array may cause a voltage supplied to the memory array by the regulator to oscillate—e.g., if the current changes rapidly, the stability of the voltage supplied to the memory array by the regulator may be affected. In some instances, a resistor-capacitor (RC) circuit may be coupled with the voltage supplied to the memory array and provide a feedback signal to the regulator—e.g., an analog feedback circuit. In such examples, the feedback filter (e.g., the feedback signal provided to the regulator) may be fixed—e.g., the resistance and capacitance of the RC circuit may be fixed and may be unable to be changed. Accordingly, the RC circuit may be unable to handle different bandwidths and performance levels of the memory array. Additional RC circuits (e.g., to match various bandwidth and performance levels) may take up too much space in the memory device. Additionally, the RC circuits may also take relatively a long time to reflect changes in the voltage supplied.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
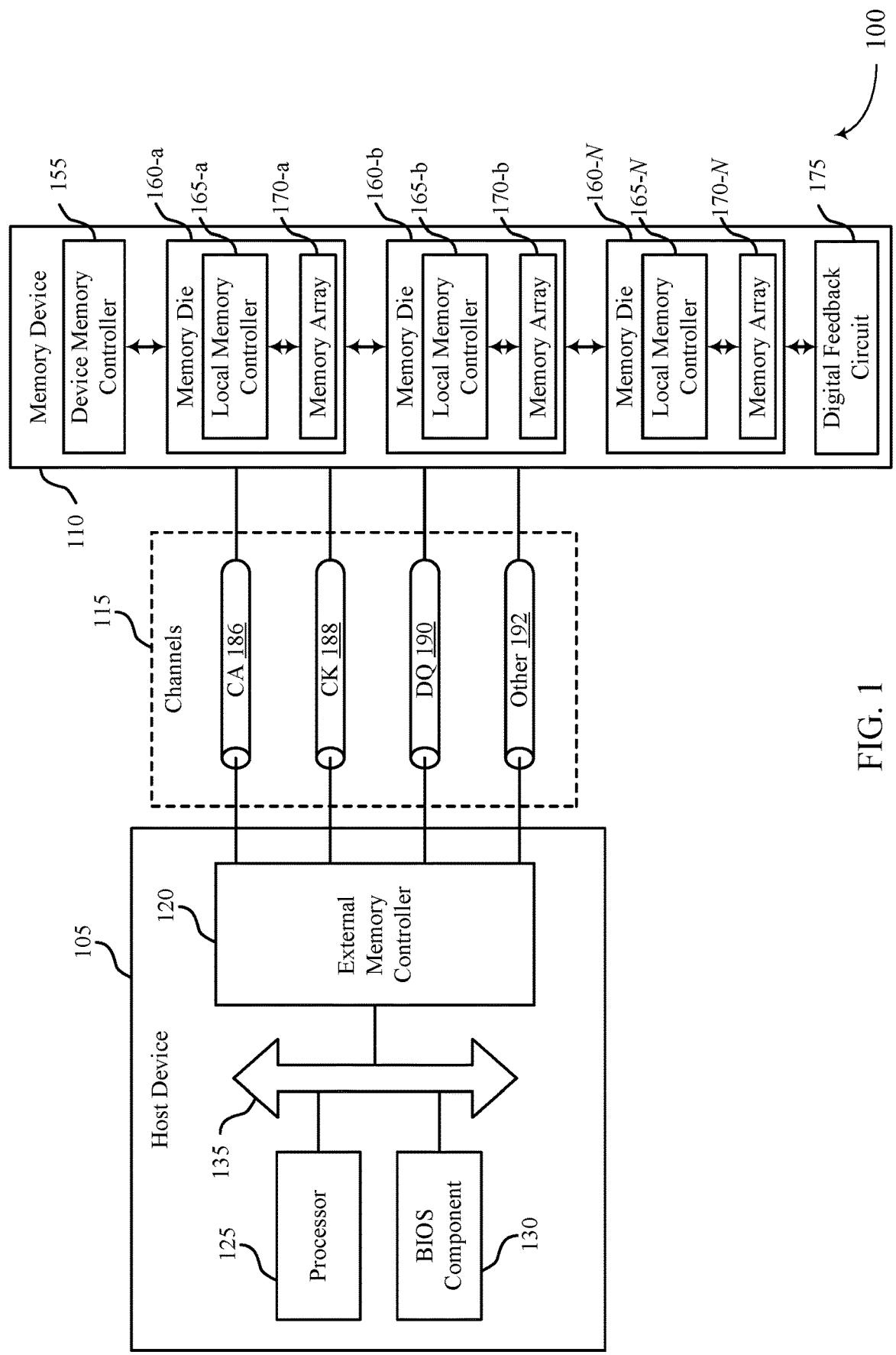
FIG. 1 illustrates an example of a system that supports varying a time average for feedback of a memory system in accordance with examples as disclosed herein.

A memory device may include a memory die or memory array to store data. In some examples, a voltage source (e.g., in a power distribution network (PDN)) may supply a voltage to the memory array during an operation performed by the memory device. Because of intrinsic resistances in the memory die, an actual voltage supplied to the memory array may be less than the voltage generated by the voltage source. In such examples, the voltage source may be coupled with a regulator to regulate the voltage supply to the memory array. In some cases, an intrinsic capacitance and current demand of the memory array may cause a voltage supplied to the memory array by the regulator to oscillate—e.g., if the current changes rapidly, the stability of the voltage supplied to the memory array by the regulator may be affected. In some instances, a resistor-capacitor (RC) circuit may be coupled with the voltage supplied to the memory array and provide a feedback signal to the regulator—e.g., an analog feedback circuit. In such examples, the feedback filter (e.g., the feedback signal provided to the regulator) may be fixed—e.g., the resistance and capacitance of the RC circuit may be fixed and may be unable to be changed. Accordingly, the RC circuit may be unable to handle different bandwidths and performance levels of the memory array. Additional RC circuits (e.g., to match various bandwidth and performance levels) may take up too much space in the memory device. Additionally, the RC circuits may also take relatively a long time to reflect changes in the voltage supplied.

Systems, techniques, and devices are described herein for a memory device to supply a voltage to a memory array utilizing a regulator and a digital feedback circuit that generates feedback including information averaged over a duration. For example, the digital feedback circuit may be coupled with the regulator and the memory array and receive a signal indicating a voltage supplied to the memory array. The digital feedback circuit may include an oscillator, a counter, and a digital-to-analog circuit (DAC). The oscillator may generate a second analog signal that operates at a first frequency in response to the magnitude of the signal indicating the voltage to the memory array. In some examples, the counter may count a quantity of oscillations of the second analog signal over a selected duration. That is, the memory device may select a duration based on performance or bandwidth constraints of the memory device—e.g., a shorter duration may increase responsiveness and a longer duration may result in a more stable output. The DAC may convert a digital signal outputted by the counter to a third analog signal and transmit the third analog signal back to the regulator to provide a feedback signal to improve the regulation of the voltage supplied to the memory array. By utilizing a digital feedback circuit, the memory device may supply a better regulated voltage to the memory array and handle various bandwidth and performance levels of the memory cells. Additionally, the digital feedback circuit may conserve area on the memory device compared to other examples.

Features of the disclosure are initially described in the context of systems and dies as described with reference to FIGS. 1 and 2. Features of the disclosure are described in the context circuits and flowchart as described with reference to FIGS. 3 and 4. These and other features of the disclosure are further illustrated by and described with reference to an apparatus diagram and a flowchart that relate to varying a time average for feedback of a memory system as described with reference to FIGS. 5 and 6.

FIG. 1 illustrates an example of a system 100 that supports varying a time average for feedback of a memory system in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 a, memory die 160 b, memory die 160 N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the memory device 110 may supply a voltage to the memory dies 160-$a$. For example, the memory device 110 may include a PDN (power delivery network) that supplies a voltage to the memory dies 160. In some examples, the memory device may supply the voltage to the memory dies 160 via a regulator. To increase the stability and accuracy of the voltage supplied to the memory dies 160, the memory device 110 may also include a digital feedback circuit 175 coupled with the memory die 160 and the regulator. In such examples, the digital feedback circuit 175 may be configured to generate a feedback signal comprising information over a variable duration—e.g., the memory device 110 may be configured to select a duration from a plurality of durations. For example, the memory device 110 may select a longer duration to supply a more stable voltage to the memory dies 160 or a shorter duration to adjust the voltage supplied to the memory dies 160 more frequently. By utilizing a digital feedback circuit 175 over a variable duration, the memory device 110 may adjust a voltage supply to the memory dies 160 based on bandwidth and performance levels of memory cells in the memory dies 160.

Figure 2:
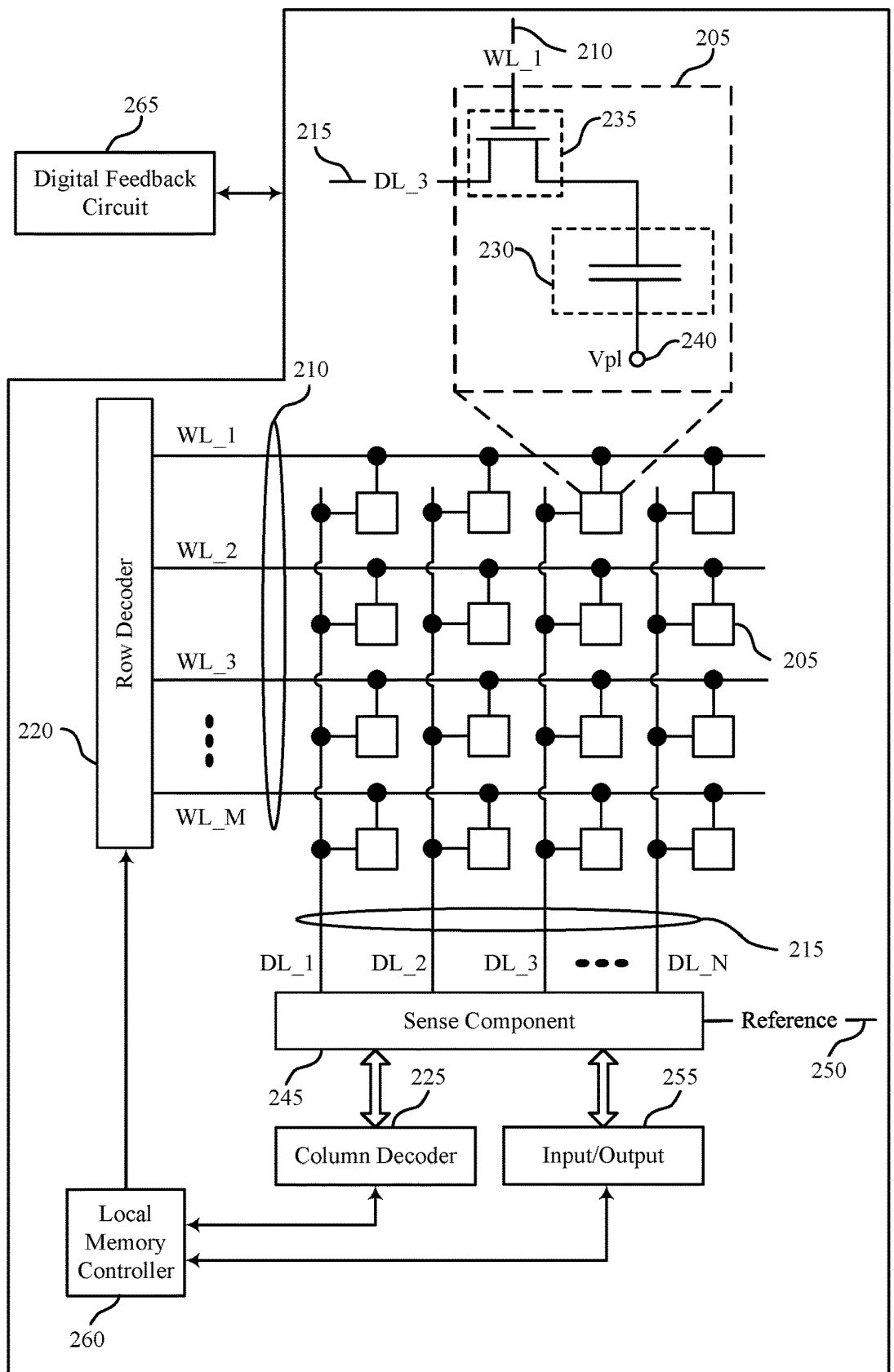
FIG. 2 illustrates an example of a memory die that supports varying a time average for feedback of a memory system in accordance with examples as disclosed herein.

FIG. 2 illustrates an example of a memory die 200 that supports varying a time average for feedback of a memory system in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern.

An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some examples, a memory device (e.g., memory device 110 as described with reference to FIG. 1) may supply a voltage to the memory die 200 during an operation. For example, the memory device may utilize a PDN to generate a voltage for the memory die 200. Additionally, the memory device may include a regulator and a digital feedback circuit 265 to increase the accuracy and stability of the voltage supplied to the memory die 200—e.g., the regulator and digital feedback circuit 265 may adjust the voltage from the PDN to account for an intrinsic capacitance and current demand of the memory die 200. In some examples, the digital feedback circuit 265 may generate a time-averaged feedback signal over a duration selected by the memory device. That is, the memory device may select a duration from a plurality of durations to monitor the feedback signal. In such examples, the memory device may adjust the duration based on a performance level or bandwidth constraint of a memory cell 205 of the memory die 200. For example, the memory device may select a longer duration to supply a more stable voltage to the memory die 200 or a shorter duration adjust the voltage supplied to the memory die 200 more frequently.

Figure 3:
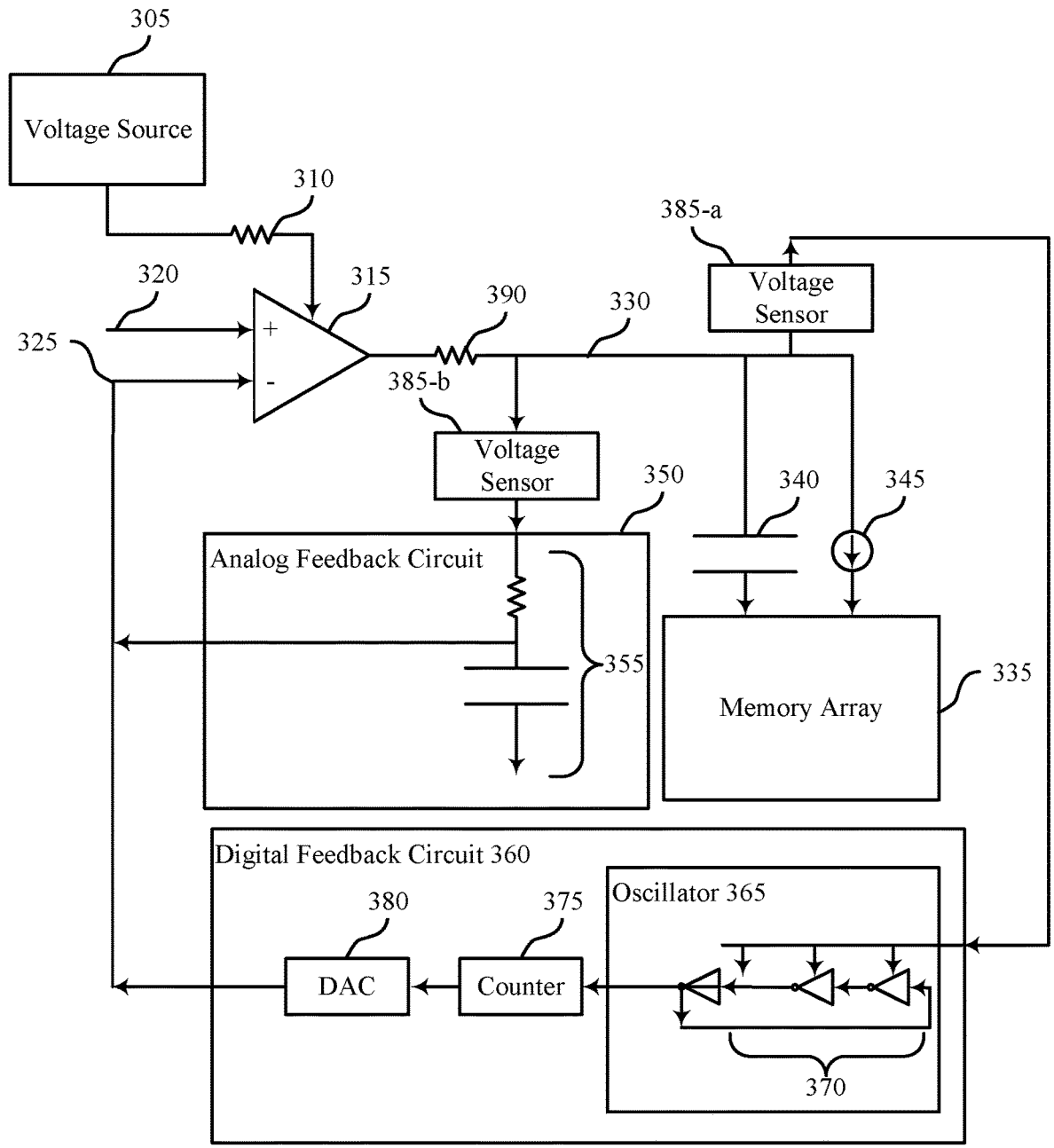
FIG. 3 illustrates an example of a circuit that supports varying a time average for feedback of a memory system in accordance with examples as disclosed herein.

FIG. 3 illustrates an example of a circuit 300 that supports varying a time average for feedback of a memory system in accordance with examples as disclosed herein. Circuit 300 may be utilized to provide a voltage from a voltage source 305 to a memory array 335 in a memory device (e.g., memory device 110 as described with reference to FIG. 1). In some examples, the circuit 300 may be included on a memory die (e.g., memory die 160 as described with reference to FIG. 1). In other examples, the analog feedback circuit 350 or digital feedback circuit 360, or both may be off the memory die. Circuit 300 may include a voltage source 305, a regulator 315, a memory array 335, an analog feedback circuit 350, a digital feedback circuit 360, and a voltage sensor 385. The analog feedback circuit 350 may further include a resistor-capacitor (RC) circuit 355. The digital feedback circuit 360 may further include an oscillator 365, a counter 375, and digital-to-analog converter (DAC) 380. In some examples, the circuit 300 may be controlled by a controller (e.g., device memory controller 155 or local memory controller 165 as described with reference to FIG. 1). In other examples, components of circuit 300 may be operated by a fuse or a timer.

Voltage source 305 may be configured to generate a voltage for or supply a voltage to the memory array 335. For example, the voltage source 305 may generate a voltage to activate the memory array 335 or supply a voltage to the memory array 335 during an operation (e.g., a read, write, refresh, or other operations associated with the memory array 335). In some examples, the voltage source 305 may be a pad. In other examples, the voltage source may also be referred to as a PDN. In some cases, an intrinsic resistance 310 may cause the voltage generated or supplied by the voltage source 305 to drop—e.g., the voltage source may generate a voltage (VDD) that decrease due to the intrinsic resistance 310. That is, the intrinsic resistance 310 may not be a physical component in the circuit 300 and may instead represent an intrinsic resistance of a supply line supplying the voltage or the memory array 335.

Regulator 315 may be configured to receive the voltage from the voltage source 305 and supply a second voltage to the memory array 335—e.g., the output voltage 330 to the memory array 335. In some examples, the regulator 315 may be configured to regulate the outputted second voltage 330 to be the same as a desired voltage for the memory array 335—e.g., to regulate the second voltage 330 to be as close to VDD as possible. In some examples, the regulator 315 may receive a reference voltage 320 (e.g., VDD) and a feedback signal 325 to determine the difference between a desired voltage (e.g., VDD) for the memory array 335 and the actual voltage of the memory array 335. In such examples, the actual voltage of the memory array 335 may be affected by an intrinsic resistance 390, capacitance 340, and current demand 345 of the memory array 335. That is, the regulator 315 may be configured to regulate the voltage supplied to the memory array (e.g., the second voltage 330) and reduce an inherent drop in the second voltage 330 based on the intrinsic resistance 390, capacitance 340, and current demand 345 of the memory array 335. In such examples, the intrinsic resistance 390, capacitor 340, and current demand 345 may not be physical components in the circuit 300 and may instead be symbolic representations of the intrinsic properties of the memory device. In some examples, the regulator 315 may receive the feedback signal 325 from the analog feedback circuit 350. In other examples, the regulator 315 may receive the feedback signal 325 from the digital feedback circuit 360. That is, the circuit 300 may further include switches or other similar components to select either the analog feedback circuit 350 or the digital feedback circuit 360.

Memory array 335 may be configured to store data for a host device (e.g., host device 105 as described with reference to FIG. 1). In some examples, the memory array 335 may be configured to receive the output voltage 330—e.g., during an operation associated with the memory array 335. The actual voltage at the memory array 335 may differ from a desired voltage of the memory array 335 (e.g., VDD) based on the intrinsic resistance 390, capacitance 340, and current demand 345 of the memory array 335.

Voltage sensors 385 may be configured to measure an actual voltage of the memory array 335—e.g., based on the intrinsic resistance 390, capacitance 340, and current demand 345 of the memory array 335. In some examples, the voltage sensors 385 may further be configured to generate a signal indicating the actual voltage of the memory array to a feedback circuit. For example, voltage sensor 385-a may provide a signal indicating a voltage at the memory array 335 to the digital feedback circuit 360 and voltage sensor 385-b may provide a signal indicating the voltage at the memory array 335 to the analog feedback circuit 350.

In some examples, the circuit 300 may include one or more analog feedback circuits 350 or one or more digital feedback circuits 360, but not both. In such examples, the circuit 300 may be configured with analog feedback circuits 350 or digital feedback circuits. In some examples, the circuit 300 may include both analog feedback circuits 350 and digital feedback circuits 360. In such examples, it may be selected that the circuit 300 is to use between using an analog feedback circuit 350 or a digital feedback circuit 360. In some cases, the selection between the analog feedback circuit 350 and the digital feedback circuit 360 may be dynamically selectable by control logic of the circuit 300. In some cases, the selection between the analog feedback circuit 350 and the digital feedback circuit 360 may be determined during a manufacturing process or a testing process and may be hard-coded into the circuit (e.g., using a fuse or anti-fuse).

Analog feedback circuit 350 may be configured to generate a feedback signal 325 and transmit the feedback signal 325 to the regulator 315. In some examples, the analog feedback circuit 350 may include one or more RC circuits 355. In some examples, the RC circuits 355 may be configured to generate an analog feedback signal based on receiving the signal indicating the voltage of the memory array from the voltage sensor 385-b and the resistance and capacitance values of the RC circuit 355. That is, different resistance and capacitance values for the resistor and capacitor, respectively, may change the feedback signal 325 generated for the regulator 315. In some examples, a quantity of difference RC circuit combinations (e.g., combinations of different resistive and capacitive values) may be limited by a size of the memory die 200—e.g., the analog feedback circuit 350 may be unable to achieve some results using the feedback signal 325 for different bandwidth constraints and performance levels of the memory array 335.

Digital feedback circuit 360 may be configured to generate a feedback signal 325 and transmit the feedback signal to the regulator 315. In some examples, oscillator 365 may receive a signal indicating a voltage of the memory array 335 (e.g., a first analog signal) from the voltage sensor 385-a. In such examples, the plurality of inverters 370 may be configured to receive the first analog signal and generate a second analog signal that operates at a first frequency in response to the magnitude of the signal indicating the voltage of the memory array 335. That is, the second analog signal has a quantity of oscillations that are proportional (or inversely proportional) to the magnitude of the signal indicating the signal indicating the voltage of the memory array 335 (e.g., the first analog signal). In some examples, the oscillator 365 may further be configured to transmit the second analog signal to the counter 375.

The counter 375 may be configured to measure or determine a quantity of oscillations of the second analog signal received from the oscillator 365 during a selected duration. For example, the counter may initiate a count and increase a count value by a quantity one (1) each time an oscillation is measured. In some examples, the counter 375 may generate a digital signal and transmit the digital signal to the DAC 380 based on determining the quantity of oscillations. In some examples, the counter 375 may be configured to determine the quantity of oscillations over a variable duration. That is, the counter 375 may be configured to determine the quantity of oscillations over a duration from a plurality of durations. In such examples, the memory device may select a duration from the plurality of durations before the counter 375 receives the second analog signal or before the signal indicating the voltage of the memory array 335 at the digital feedback circuit 360. In some cases, the memory device may select a duration based on a performance level or bandwidth constraint of memory cells (e.g., memory cells 205 as described with reference to FIG. 2) in the memory array 335. For example, the memory device may select a shorter duration to adjust the voltage supplied to the memory array 335 more frequently—e.g., adjust the voltage 330 outputted by the regulator more frequently. This may allow the memory device to reduce drops in the voltage supplied to the memory array 335. In other examples, the memory device may select a longer duration to increase stability of the voltage supplied to the memory array 335. Additionally, the counter 375 may be configured to reset the count value after transmitting the digital signal to the DAC 380 or before receiving a different analog signal from the oscillator 365.

DAC 380 may be configured to convert the digital signal received from the counter 375 into a third analog signal. The DAC 380 may also transmit the third analog signal to the regulator 315 (or control logic associated with the regulator 315). In some examples, the third analog signal (e.g., feedback signal 325) may include feedback information averaged over the selected duration. For example, the third analog signal may indicate an average voltage of the memory array over the selected duration. In some cases, the feedback signal 325 may enable the regulator 315 to adjust the output voltage 330 to better align with a desired voltage of the memory array 335. By utilizing the digital feedback circuit 360, the memory device may determine feedback information averaged over a variable duration and adjust the voltage supplied to the memory array 335 based on bandwidth and performance levels of the memory cells 205.

Figure 4:
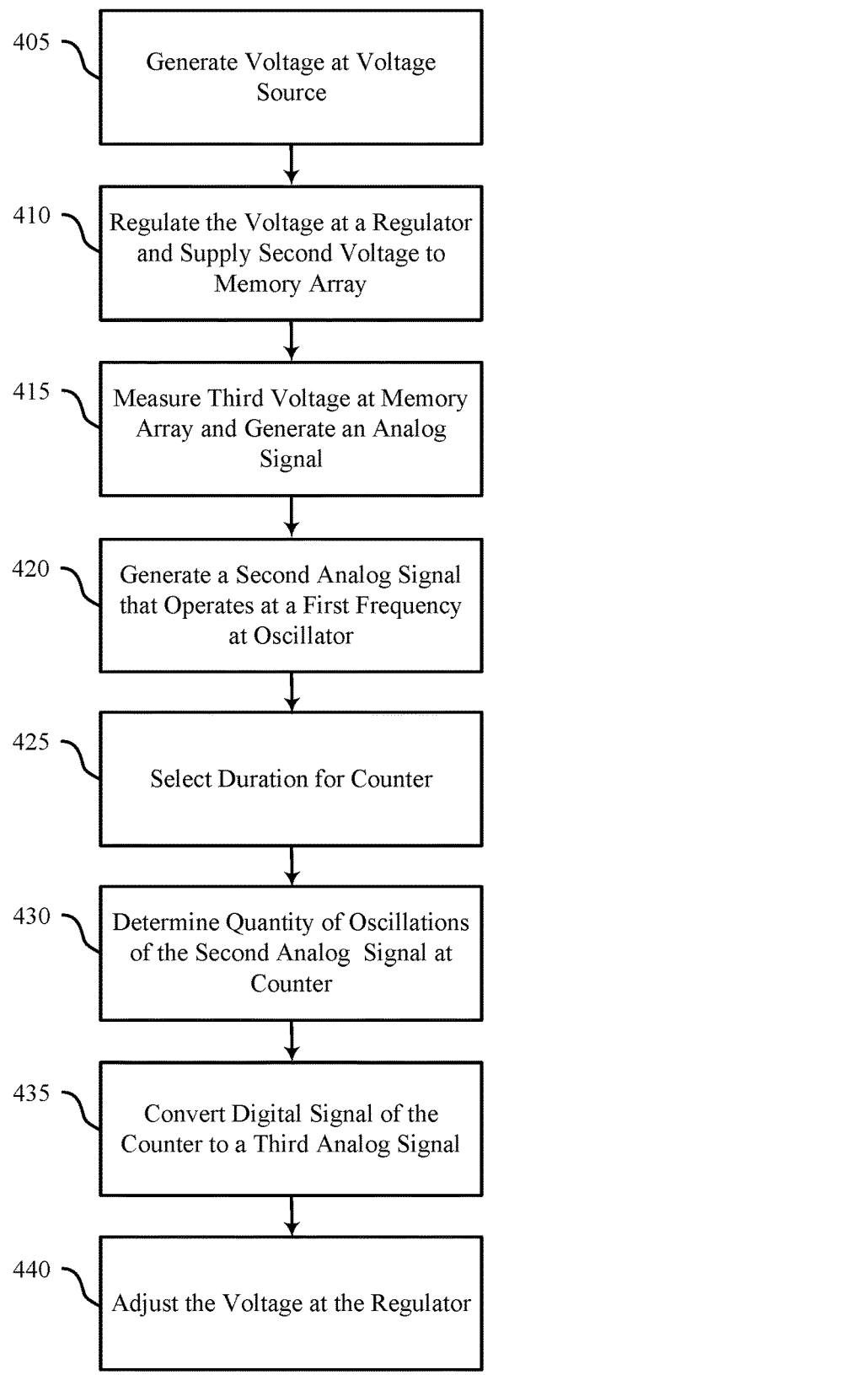
FIG. 4 illustrates an example of a flowchart that supports varying a time average for feedback of a memory system in accordance with examples as disclosed herein.

FIG. 4 illustrates an example of a flowchart 400 that supports varying a time average for feedback of a memory system in accordance with examples as disclosed herein. For example, flowchart 400 may be performed by a memory device (e.g., memory device 110 as described with reference to FIG. 1) and a circuit (e.g., circuit 300 as described with reference to FIG. 1). In some examples, the flowchart 400 may be performed by a controller (e.g., device memory controller 155 or local memory controller 165 as described with reference to FIG. 1). In other examples, flowchart 400 may be performed by a fuse or a timer in the circuit 300 or memory device 110. Although shown in a particular sequence or order, unless otherwise specified, the order of the processes may be modified. Thus, the illustrated examples are used as examples, and the illustrated processes may be performed in a different order, and some processes may be performed in parallel. Additionally, one or more processes may be omitted in various examples. Thus, not all processes are used in every example. Other process diagrams are possible. The flowchart 400 illustrates examples of a memory device utilizing a digital feedback circuit (e.g., digital feedback circuit 360 as described with reference to FIG. 3) over a variable duration to provide a negative feedback signal to a regulator (e.g., regulator 315 as described with reference to FIG. 3) supplying a voltage to a memory array (e.g., memory array 335 as described with reference to FIG. 3).

At 405, a voltage source (e.g., voltage source 305 as described with reference to FIG. 3) may generate a voltage. For example, the voltage source may generate a voltage VDD. In some examples, the voltage source may also transmit the voltage to a regulator (e.g., regulator 315 as described with reference to FIG. 3).

At 410, the regulator may regulate the voltage by suppling a second voltage to a memory array (e.g., memory array 335 as described with reference to FIG. 3). In some examples, the regulator may generate the second voltage based on the voltage received from the voltage source. Additionally, the regulator may receive a reference voltage (e.g., a desired voltage for the memory array) and a negative feedback signal (e.g., feedback signal 325 as described with reference to FIG. 3). In such cases, the regulator may generate the second voltage based on receiving the reference voltage and the negative feedback signal.

At 415, a voltage sensor (e.g., voltage sensor 385 as described with reference to FIG. 3) may measure a third voltage at the memory array. In some examples, an intrinsic resistance (e.g., resistance 390), intrinsic capacitance (e.g., capacitor 340), or a current drop (e.g., current demand 345), or any combination thereof, of the memory array may cause the third voltage at the memory array to be different than the second voltage generated by the regulator. In such examples, the memory device may select a digital feedback circuit to generate the negative feedback signal to more accurately regulate the voltage supplied by the regulator. In some examples, the memory device may also deactivate the analog feedback circuit 350 when selecting the digital feedback circuit. Accordingly, the voltage sensor may generate and transmit an analog signal (e.g., a first analog signal) to the digital feedback circuit to indicate the third voltage at the memory array.

At 420, an oscillator (e.g., oscillator 365) may generate a second analog signal based on receiving the first analog signal from the voltage sensor. In such examples, the oscillator may utilize a plurality of inverters (e.g., inverters 370) to generate the second analog signal. In some cases, the second analog signal generated by the oscillators may operate at a first frequency in response to the magnitude of the first analog signal. That is, the second analog signal has a quantity of oscillations that are proportional to the magnitude of the first signal. In some examples, the oscillator may transmit the second analog signal to a counter (e.g., counter 375 as described with reference to FIG. 3).

At 425, a duration for the counter may be selected. For example, a controller (e.g., device memory controller 155 or local memory controller 165) may select the duration for the counter. In some examples, the duration of the counter may be variable. In such examples, the controller may select a duration for the counter from a plurality of durations. In some cases, the controller may select the duration based on bandwidth constraints or performance levels of the memory array. For example, the controller may select a duration of 100 nanoseconds. In some examples, the duration of the counter may be selected before the voltage source is generated, before the voltage is regulated, before the third voltage of the memory array is measured, or before the oscillator receives the first analog signal. In other examples, the controller may maintain the last duration of the counter—e.g., the controller may maintain 100 nanoseconds based on a previous duration being 100 nanoseconds.

At 430, the counter may determine a quantity of oscillations of the second analog signal over the duration. For example, the counter may initiate a count value based on receiving the second analog signal. In some examples, the counter may increment the count value by a quantity one (1) each time an oscillation of the second analog signal is measuring—e.g., increment the count value from zero (0) to one (1) based on measuring a first oscillation of the second analog signal. In such examples, the counter may continue to increment the count value until the duration selected expires. After the duration expires, the counter may generate a digital signal indicating the quantity of oscillations of the second analog signal over the duration. Additionally, the counter may transmit the digital signal to a DAC (e.g., DAC 380 as described with reference to FIG. 3). In some cases, the counter may also reset the count value based on transmitting the digital signal—e.g., the counter may reset the count value to zero (0) based on transmitting the digital signal. In other examples, the counter may be reset when selecting the duration for the counter or at a time before the counter receives an analog signal from the oscillator.

At 435, the DAC may convert the digital signal into a third analog signal based on receiving the digital signal from the counter. In some examples, the DAC may also transmit the third analog signal to the regulator. That is, the third analog signal may be the negative feedback signal.

At 440, the regulator may adjust the voltage generated based on receiving the negative feedback signal. That is, the negative feedback signal may indicate an average voltage at the memory array over the duration. The regulator may adjust the voltage to bring the third voltage at the memory array closer to the desired voltage of the memory array— e.g., closer to VDD. In some examples, after adjusting the voltage at the regulator, the circuit may repeat the process described at 415-440. That is, the voltage sensor may measure a new voltage at the memory array based on the voltage adjustment by the regulator. The voltage sensor may transmit a new analog signal to the oscillator and the oscillator may generate another analog signal operating at a second frequency in response to a magnitude of the new analog signal. The controller may then maintain the duration for the counter or select a second duration from the plurality of durations for the counter. The counter may then generate a second digital signal which may be converted and transmitted back to the regulator by the DAC. By utilizing the digital feedback circuit, the memory device may be able to better regulate the voltage supply based on a variable time averaged negative feedback signal. For example, the memory device may regulate the voltage based on different bandwidth or performance levels of the memory cells because the negative feedback signal is over a variable time.

Figure 5:
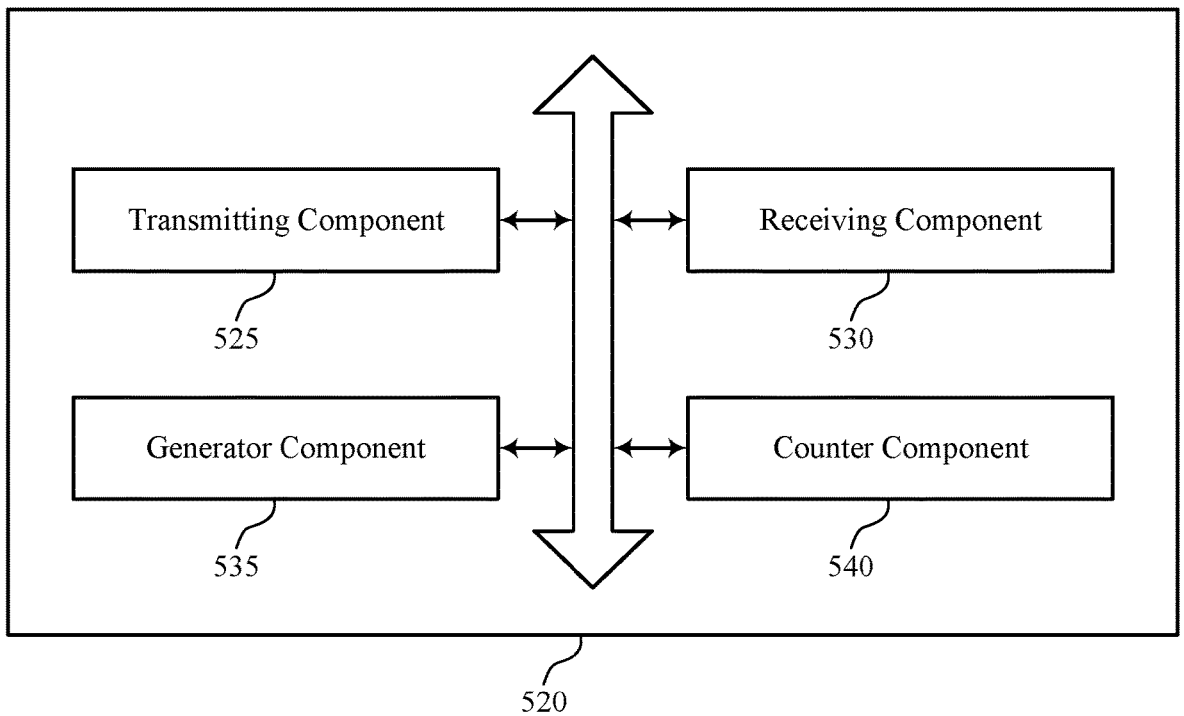
FIG. 5 shows a block diagram of a memory device that supports varying a time average for feedback of a memory system in accordance with examples as disclosed herein.

FIG. 5 shows a block diagram 500 of a memory device 520 that supports varying a time average for feedback of a memory system in accordance with examples as disclosed herein. The memory device 520 may be an example of aspects of a memory device as described with reference to FIGS. 1 through 4. The memory device 520, or various components thereof, may be an example of means for performing various aspects of varying a time average for feedback of a memory system as described herein. For example, the memory device 520 may include a transmitting component 525, a receiving component 530, a generator component 535, a counter component 540, or any combination thereof. Each of these components may communicate, directly or indirectly, with one another (e.g., via one or more buses).

The transmitting component 525 may be configured as or otherwise support a means for transmitting a first voltage from a voltage source to a regulator. In some examples, the transmitting component 525 may be configured as or otherwise support a means for transmitting a second voltage from the regulator to a memory array based at least in part on transmitting the first voltage. In some examples, the transmitting component 525 may be configured as or otherwise support a means for transmitting, from the digital feedback circuit to the regulator, an analog signal based at least in part on generating the feedback. In some cases, the transmitting component 525 may be configured as or otherwise support a means for transmitting, to an oscillator of the digital feedback circuit, the first signal indicating the voltage of the memory array.

In some instances, the transmitting component 525 may be configured as or otherwise support a means for transmitting, to a counter of the digital feedback circuit, the second analog signal based at least in part on generating the second analog signal.

The receiving component 530 may be configured as or otherwise support a means for receiving, at a digital feedback circuit, a first signal indicating a voltage of the memory array based at least in part on transmitting the second voltage to the memory array. In some examples, the receiving component 530 may be configured as or otherwise support a means for receiving, at the digital feedback circuit, a second signal indicating a third voltage of the memory array after the duration.

The generator component 535 may be configured as or otherwise support a means for generating, by the digital feedback circuit, feedback including information averaged over a duration based at least in part on receiving the first signal. In some cases, the generator component 535 may be configured as or otherwise support a means for generating, by the oscillator, a second analog signal that operates at a first frequency in response to a magnitude of the first signal based at least in part on transmitting the first signal to the oscillator. In some instances, the generator component 535 may be configured as or otherwise support a means for generating a digital signal based at least in part on determining the quantity of oscillations.

In some examples, the generator component 535 may be configured as or otherwise support a means for converting, at a digital-to-analog converter, the digital signal to the analog signal based at least in part on generating the digital signal. In some cases, the generator component 535 may be configured as or otherwise support a means for generating, at the oscillator, a third analog signal based at least in part on receiving the second signal; and transmitting the third analog signal to the counter. In some instances, the generator component 535 may be configured as or otherwise support a means for generating a second digital signal based at least in part on determining the second quantity of oscillations.

In some examples, the counter component 540 may be configured as or otherwise support a means for selecting the duration from a plurality of durations for the counter. In some cases, the counter component 540 may be configured as or otherwise support a means for determining, at the counter, a quantity of oscillations of the second analog signal during the duration, where the quantity of oscillations during the duration is associated with the feedback. In some instances, the counter component 540 may be configured as or otherwise support a means for resetting the counter to a default value based at least in part on converting the digital signal to the analog signal. In some examples, the counter component 540 may be configured as or otherwise support a means for selecting the duration for the counter. In some cases, the counter component 540 may be configured as or otherwise support a means for determining, at the counter, a second quantity of oscillations of the third analog signal during the duration.

In some examples, the counter component 540 may be configured as or otherwise support a means for selecting a second duration of the plurality of durations for the counter. In some instances, the counter component 540 may be configured as or otherwise support a means for determining, at the counter, a second quantity of oscillations of the third analog signal during the duration; and generating a second digital signal based at least in part on determining the second quantity of oscillations.

Figure 6:
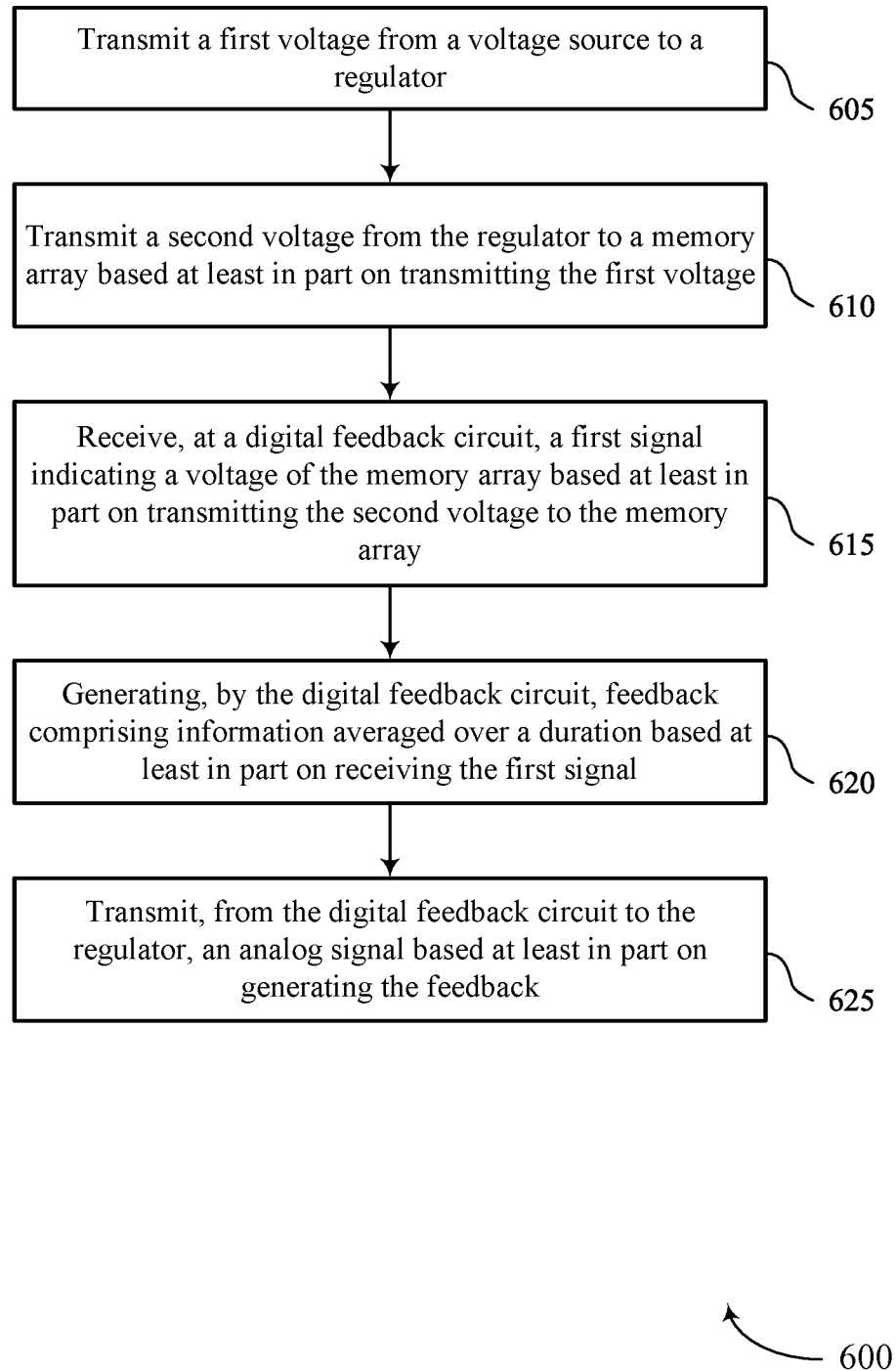
FIG. 6 shows a flowchart illustrating a method or methods that support varying a time average for feedback of a memory system in accordance with examples as disclosed herein.

FIG. 6 shows a flowchart illustrating a method 600 that supports varying a time average for feedback of a memory system in accordance with examples as disclosed herein.

The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 605, the method may include transmitting a first voltage from a voltage source to a regulator. The operations of 605 may be performed in accordance with examples as disclosed herein. In some examples, aspects of the operations of 605 may be performed by a transmitting component 525 as described with reference to FIG. 5.

At 610, the method may include transmitting a second voltage from the regulator to a memory array based at least in part on transmitting the first voltage. The operations of 610 may be performed in accordance with examples as disclosed herein. In some examples, aspects of the operations of 610 may be performed by a transmitting component 525 as described with reference to FIG. 5.

At 615, the method may include receiving, at a digital feedback circuit, a first signal indicating a voltage of the memory array based at least in part on transmitting the second voltage to the memory array. The operations of 615 may be performed in accordance with examples as disclosed herein. In some examples, aspects of the operations of 615 may be performed by a receiving component 530 as described with reference to FIG. 5.

At 620, the method may include generating, by the digital feedback circuit, feedback including information averaged over a duration based at least in part on receiving the first signal. The operations of 620 may be performed in accordance with examples as disclosed herein. In some examples, aspects of the operations of 620 may be performed by a generator component 535 as described with reference to FIG. 5.

At 625, the method may include transmitting, from the digital feedback circuit to the regulator, an analog signal based at least in part on generating the feedback. The operations of 625 may be performed in accordance with examples as disclosed herein. In some examples, aspects of the operations of 625 may be performed by a transmitting component 525 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for transmitting a first voltage from a voltage source to a regulator, transmitting a second voltage from the regulator to a memory array based at least in part on transmitting the first voltage, receiving, at a digital feedback circuit, a first signal indicating a voltage of the memory array based at least in part on transmitting the second voltage to the memory array, generating, by the digital feedback circuit, feedback including information averaged over a duration based at least in part on receiving the first signal, and transmitting, from the digital feedback circuit to the regulator, an analog signal based at least in part on generating the feedback.

Some cases of the method 600 and the apparatus described herein may further include operations, features, circuitry, logic, means, or instructions for transmitting, to an oscillator of the digital feedback circuit, the first signal indicating the voltage of the memory array, generating, by the oscillator, a second analog signal that operates at a first frequency in response to a magnitude of the first signal based at least in part on transmitting the first signal to the oscillator, and transmitting, to a counter of the digital feedback circuit, the second analog signal based at least in part on generating the second analog signal.

Some instances of the method 600 and the apparatus described herein may further include operations, features, circuitry, logic, means, or instructions for selecting the duration from a plurality of durations for the counter, determining, at the counter, a quantity of oscillations of the second analog signal during the duration, where the quantity of oscillations during the duration may be associated with the feedback, and generating a digital signal based at least in part on determining the quantity of oscillations.

In some examples of the method 600 and the apparatus described herein, converting, at a digital-to-analog converter, the digital signal to the analog signal based at least in part on generating the digital signal.

Some cases of the method 600 and the apparatus described herein may further include operations, features, circuitry, logic, means, or instructions for resetting the counter to a default value based at least in part on converting the digital signal to the analog signal.

Some instances of the method 600 and the apparatus described herein may further include operations, features, circuitry, logic, means, or instructions for receiving, at the digital feedback circuit, a second signal indicating a third voltage of the memory array after the duration and generating, at the oscillator, a third analog signal based at least in part on receiving the second signal; and transmitting the third analog signal to the counter.

Some examples of the method 600 and the apparatus described herein may further include operations, features, circuitry, logic, means, or instructions for selecting the duration for the counter, determining, at the counter, a second quantity of oscillations of the third analog signal during the duration, and generating a second digital signal based at least in part on determining the second quantity of oscillations.

Some cases of the method 600 and the apparatus described herein may further include operations, features, circuitry, logic, means, or instructions for selecting a second duration of the plurality of durations for the counter and determining, at the counter, a second quantity of oscillations of the third analog signal during the duration; and generating a second digital signal based at least in part on determining the second quantity of oscillations.

It should be noted that the methods described herein describe possible implementations, and that the operations and the steps may be rearranged or otherwise modified and that other implementations are possible. Further, portions from two or more of the methods may be combined.

An apparatus is described. The apparatus may include a voltage supply, a memory array, a regulator coupled with the voltage supply and the memory array and configured to supply a first voltage received from the voltage supply to the memory array, a voltage sensor configured to measure a second voltage of the memory array, and a digital feedback circuit coupled with the memory array and the regulator and configured to generate feedback including information averaged over a duration based at least in part on the second voltage measured by the voltage sensor and to transmit an analog signal to the regulator based at least in part on the feedback.

In some instances of the apparatus, the digital feedback circuit further includes an oscillator including one or more inverters and configured to receive a signal indicating the second voltage of the memory array based at least in part on the second voltage measured by the voltage sensor.

In some cases, the apparatus may include generate a second analog signal that operates at a first frequency in response to magnitude of the signal.

In some instances, the apparatus may include receive the second analog signal from the oscillator, determine a count of a quantity of oscillations of the second analog signal during the duration based on receiving the second analog signal, where generating the feedback may be based at least in part on the count, and generate a digital signal based at least in part on determining the quantity of oscillations during the duration.

In some examples of the apparatus, the digital feedback circuit further includes a digital-to-analog circuit configured to receive the digital signal and generate the analog signal, where the digital feedback circuit transmits the analog signal to the regulator based at least in part on the digital-to-analog circuit generating the analog signal.

In some cases of the apparatus, the digital feedback circuit may be further configured to apply the duration from a selection of a plurality of durations associated with the counter.

In some instances of the apparatus, the counter may be configured to reset to a default value based at least in part on transmitting the digital signal to a digital-to-analog circuit.

In some examples of the apparatus, the analog signal indicates an average voltage of the memory array over the duration.

In some cases, the apparatus may include a resistor-capacitor circuit coupled with the regulator and configured to generate an analog feedback signal based at least in part on the second voltage of the memory array and transmit the analog feedback signal to the regulator.

In some examples of the apparatus, the apparatus may be configured to select between using the digital feedback circuit or the resistor-capacitor circuit.

Another apparatus is described. The apparatus may include a memory array and a controller coupled with the memory array and configured to cause the apparatus to transmit a first voltage from a voltage source to a regulator, transmit a second voltage from the regulator to the memory array based at least in part on transmitting the first voltage, receive, at a digital feedback circuit, a first signal indicating a voltage of the memory array based at least in part on transmitting the second voltage to the memory array, generate, by the digital feedback circuit, feedback including information averaged over a duration based at least in part on receiving the first signal, and transmit, from the digital feedback circuit to the regulator, an analog signal based at least in part on generating the feedback.

In some examples, the controller may further be configured to cause the apparatus to transmit, to an oscillator of the digital feedback circuit, the first signal indicating the voltage of the memory array, generate, by the oscillator, a second analog signal that operates at a first frequency in response to a magnitude of the first signal based at least in part on transmitting the first signal to the oscillator, and transmit, to a counter of the digital feedback circuit, the second analog signal based at least in part on generating the second analog signal.

In some cases, the controller may further be configured to cause the apparatus to select the duration from a plurality of durations for the counter, determine, at the counter, a quantity of oscillations of the second analog signal during the duration, where the quantity of oscillations during the duration may be associated with the feedback, and generate a digital signal based at least in part on determining the quantity of oscillations.

In some instances of the apparatus, the controller may be further configured to convert, at a digital-to-analog converter, the digital signal to the analog signal based at least in part on generating the digital signal.

In some cases, the controller may further be configured to cause the apparatus to reset the counter to a default value based at least in part on converting the digital signal to the analog signal.

In some instances, the controller may further be configured to cause the apparatus to receive, at the digital feedback circuit, a second signal indicating a third voltage of the memory array after the duration and generate, at the oscillator, a third analog signal based at least in part on receiving the second signal; and transmitting the third analog signal to the counter.

In some cases, the controller may further be configured to cause the apparatus to select the duration for the counter and determine, at the counter, a second quantity of oscillations of the third analog signal during the duration; and generating a second digital signal based at least in part on determining the second quantity of oscillations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a voltage supply;
   a memory array;
   a regulator coupled with the voltage supply and the memory array and configured to supply a first voltage received from the voltage supply to the memory array;
   a voltage sensor configured to measure a second voltage of the memory array;
   a resistor-capacitor circuit coupled with the regulator and configured to generate an analog feedback signal based at least in part on the second voltage of the memory array and transmit the analog feedback signal to the regulator; and
   a digital feedback circuit coupled with the memory array and the regulator and configured to generate feedback comprising information averaged over a duration based at least in part on the second voltage measured by the voltage sensor and to transmit an analog signal to the regulator based at least in part on the feedback.

2. The apparatus of claim 1, wherein the digital feedback circuit further comprises:
   an oscillator comprising one or more inverters and configured to receive a signal indicating the second voltage of the memory array based at least in part on the second voltage measured by the voltage sensor.

3. The apparatus of claim 2, wherein the oscillator is further configured to:
   generate a second analog signal that operates at a first frequency in response to magnitude of the signal.

4. The apparatus of claim 3, wherein the digital feedback circuit further comprises a counter coupled with the oscillator, the counter configured to:
   receive the second analog signal from the oscillator;
   determine a count of a quantity of oscillations of the second analog signal during the duration based on receiving the second analog signal, wherein generating the feedback is based at least in part on the count; and
   generate a digital signal based at least in part on determining the quantity of oscillations during the duration.

5. The apparatus of claim 4, wherein the digital feedback circuit further comprises:
   a digital-to-analog circuit configured to receive the digital signal and generate the analog signal, wherein the digital feedback circuit transmits the analog signal to the regulator based at least in part on the digital-to-analog circuit generating the analog signal.

6. The apparatus of claim 4, wherein the digital feedback circuit is further configured to apply the duration from a selection of a plurality of durations associated with the counter.

7. The apparatus of claim 4, wherein the counter is configured to reset to a default value based at least in part on transmitting the digital signal to a digital-to-analog circuit.

8. The apparatus of claim 1, wherein the analog signal indicates an average voltage of the memory array over the duration.

9. The apparatus of claim 1, wherein the apparatus is configured to select between using the digital feedback circuit or the resistor-capacitor circuit.

10. A method, comprising:
    transmitting a first voltage from a voltage source to a regulator;
    transmitting a second voltage from the regulator to a memory array based at least in part on transmitting the first voltage;
    transmitting, to an oscillator of a digital feedback circuit, a first signal indicating a voltage of the memory array;
    receiving, at the digital feedback circuit, the first signal indicating the voltage of the memory array based at least in part on transmitting the second voltage to the memory array;
    generating, by the oscillator, a second analog signal that operates at a first frequency in response to a magnitude of the first signal based at least in part on transmitting the first signal to the oscillator;
    transmitting, to a counter of the digital feedback circuit, the second analog signal based at least in part on generating the second analog signal;
    selecting a duration from a plurality of durations for the counter;
    determining, at the counter, a quantity of oscillations of the second analog signal during the duration, wherein the quantity of oscillations during the duration is associated with the feedback;
    generating a digital signal based at least in part on determining the quantity of oscillations;
    generating, by the digital feedback circuit, feedback comprising information averaged over a duration based at least in part on receiving the first signal; and
    transmitting, from the digital feedback circuit to the regulator, an analog signal based at least in part on generating the feedback.

11. The method of claim 10, further comprising:
    converting, at a digital-to-analog converter, the digital signal to the analog signal based at least in part on generating the digital signal.

12. The method of claim 11, further comprising:
    resetting the counter to a default value based at least in part on converting the digital signal to the analog signal.

13. The method of claim 11, further comprising:
    receiving, at the digital feedback circuit, a second signal indicating a third voltage of the memory array after the duration; and
    generating, at the oscillator, a third analog signal based at least in part on receiving the second signal; and transmitting the third analog signal to the counter.

14. The method of claim 13, further comprising:
    selecting the duration for the counter;
    determining, at the counter, a second quantity of oscillations of the third analog signal during the duration;
    generating a second digital signal based at least in part on determining the second quantity of oscillations.

15. The method of claim 13, further comprising:
    selecting a second duration of the plurality of durations for the counter; and
    determining, at the counter, a second quantity of oscillations of the third analog signal during the duration; and generating a second digital signal based at least in part on determining the second quantity of oscillations.

16. An apparatus, comprising:
a memory array; and
a controller coupled with the memory array and configured to cause the apparatus to:
  transmit a first voltage from a voltage source to a regulator;
  transmit a second voltage from the regulator to the memory array based at least in part on transmitting the first voltage;
  transmit, to an oscillator of a digital feedback circuit, a first signal indicating a voltage of the memory array;
  receive, at the digital feedback circuit, the first signal indicating the voltage of the memory array based at least in part on transmitting the second voltage to the memory array;
  generate, by the oscillator, a second analog signal that operates at a first frequency in response to a magnitude of the first signal based at least in part on transmitting the first signal to the oscillator;
  transmit, to a counter of the digital feedback circuit, the second analog signal based at least in part on generating the second analog signal;
  select a duration from a plurality of durations for the counter;
  determine, at the counter, a quantity of oscillations of the second analog signal during the duration, wherein the quantity of oscillations during the duration is associated with the feedback;
  generate a digital signal based at least in part on determining the quantity of oscillations;
  generate, by the digital feedback circuit, feedback comprising information averaged over a duration based at least in part on receiving the first signal; and
  transmit, from the digital feedback circuit to the regulator, an analog signal based at least in part on generating the feedback.

17. The apparatus of claim 16, wherein the controller is further configured to:
  convert, at a digital-to-analog converter, the digital signal to the analog signal based at least in part on generating the digital signal.

18. The apparatus of claim 17, wherein the controller is further configured to:
  reset the counter to a default value based at least in part on converting the digital signal to the analog signal.

19. The apparatus of claim 17, wherein the controller is further configured to:
  receive, at the digital feedback circuit, a second signal indicating a third voltage of the memory array after the duration; and
  generate, at the oscillator, a third analog signal based at least in part on receiving the second signal; and transmitting the third analog signal to the counter.

20. The apparatus of claim 19, wherein the controller is further configured to:
  select the duration for the counter; and
  determine, at the counter, a second quantity of oscillations of the third analog signal during the duration; and generating a second digital signal based at least in part on determining the second quantity of oscillations.

* * * * *